(12) United States Patent
Yen et al.

(10) Patent No.: US 6,803,833 B2
(45) Date of Patent: Oct. 12, 2004

(54) FAST START-UP OSCILLATOR

(75) Inventors: Wen-Cheng Yen, Taichung (TW); Yu-Tong Lin, Taichung (TW)

(73) Assignee: Faraday Technology Corp., Hsinchu (TW)

(*) Notice: Subject to any disclaimer, the term of this patent is extended or adjusted under 35 U.S.C. 154(b) by 76 days.

(21) Appl. No.: 10/319,499

(22) Filed: Dec. 16, 2002

(65) Prior Publication Data

US 2004/0113706 A1 Jun. 17, 2004

(51) Int. Cl.[7] .............................................. H03L 1/100
(52) U.S. Cl. ...................... 331/175; 331/185; 331/186; 331/74; 331/135; 327/142; 327/143
(58) Field of Search .................................... 331/175, 185, 331/186, 135, 74; 327/142, 143

(56) References Cited

U.S. PATENT DOCUMENTS 6,728,891 B2 * 4/2004 Hanjani ..................... 713/300

* cited by examiner

Primary Examiner—Arnold Kinkead
(74) Attorney, Agent, or Firm—Rabin & Berdo, P.C.

(57) ABSTRACT

A fast start up oscillator. The fast start-up oscillator includes a power-on-reset detect circuit, a bandgap circuit, a voltage detect circuit, a RC-oscillator, and a count two circuit. The fast start-up oscillator is provided with a fast stabilized voltage source to ensure oscillation accurate and quickly such that the system is woken up.

10 Claims, 6 Drawing Sheets

| temp \ Ts | | Sample1 (μsec) | Sample2 (μsec) | Sample3 (μsec) |
|---|---|---|---|---|
| -10℃ | 1.2V | 9.04 | 9.02 | 8.64 |
| | 1.8V | 3.84 | 3.84 | 3.80 |
| 25℃ | 1.2V | 7.52 | 7.36 | 8.03 |
| | 1.8V | 4.40 | 4.20 | 4.11 |
| 125℃ | 1.2V | 6.24 | 6.18 | 6.20 |
| | 1.8V | 4.16 | 4.22 | 3.45 |

| temp\Td | | Sample1 (μsec) | Sample2 (μsec) | Sample3 (μsec) |
|---|---|---|---|---|
| -10°C | 1.2V | 9.92 | 9.04 | 9..20 |
| | 1.8V | 3.68 | 4.04 | 4.24 |
| 25°C | 1.2V | 7.84 | 8.81 | 8.08 |
| | 1.8V | 4.32 | 4.20 | 3.52 |
| 125°C | 1.2V | 6.64 | 6.48 | 6.24 |
| | 1.8V | 4.32 | 4.32 | 3.68 |

FAST START-UP OSCILLATOR

BACKGROUND OF THE INVENTION

1. Field of the Invention

The present invention relates to a fast start-up oscillator, and particularly to an oscillator quickly stabilized by a voltage control procedure.

2. Description of the Related Art

Digital circuits require a start-up clock to wake up the system. FIG. 1 shows a diagram of waveform in conventional oscillators. During power up process, power supply VCC does not rise to an acceptable level, thus the oscillating frequency of oscillators does not meet requirements. Conventional oscillators need to count 4000–5000 clocks to ensure that clock frequency is correct and KOUT output a correct clock. This approach, however, takes a long time to stabilize oscillators.

There is a need for a fast startup RC-oscillator to wake up digital circuits.

SUMMARY OF THE INVENTION

It is therefore an object of the present invention to provide a fast startup RC-oscillator.

To achieve the above objects, the present invention provides a fast startup RC-oscillator with a strong startup bandgap reference to regulate a voltage source consumed by the RC-oscillator.

The fast startup oscillator includes a power-on-reset detect circuit, a bandgap circuit, a RC-oscillator, a voltage detect circuit, and a count two circuit. The bandgap circuit has a strong startup circuit.

The power-on-reset detect circuit is utilized to detect a power supply reaching a acceptable level thereby sending a start signal. When receiving the start signal, the strong startup circuit of the bandgap circuit drives a large current to force the bandgap circuit to be biased properly in a short time and output a bandgap reference voltage.

The RC-oscillator has a regulated voltage source referencing the bandgap reference voltage and generating a clock signal. Frequency of the clock signal is determined by regulated voltages and current source. The regulated voltages are determined by the bandgap reference voltage. The current source is generated according to the bandgap reference voltage.

When detecting whether the regulated voltage source has reached a required level, the voltage detect circuit sends an output enable signal to the count two circuit. When receiving the output enable signal, the count two circuit starts to count two clocks and then outputs the clock signal.

BRIEF DESCRIPTION OF THE DRAWINGS

The aforementioned objects, features and advantages of this invention will become apparent by referring to the following detailed description of the preferred embodiment with reference to the accompanying drawings, wherein.

DETAILED DESCRIPTION OF THE INVENTION

Figure 1:
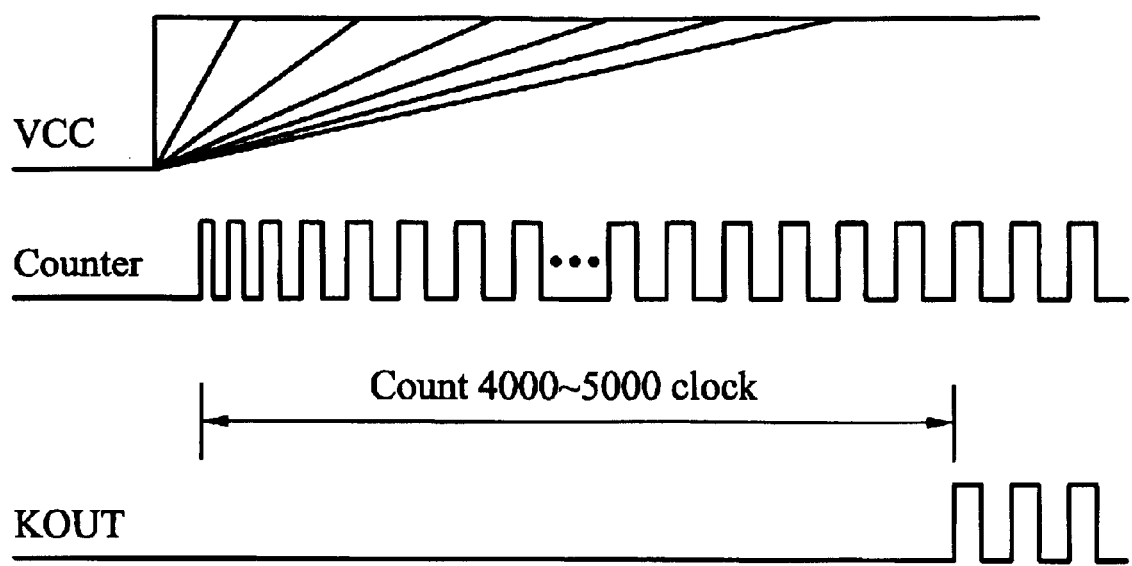
FIG. 1 shows a waveform diagram in conventional oscillators.
Figure 2:
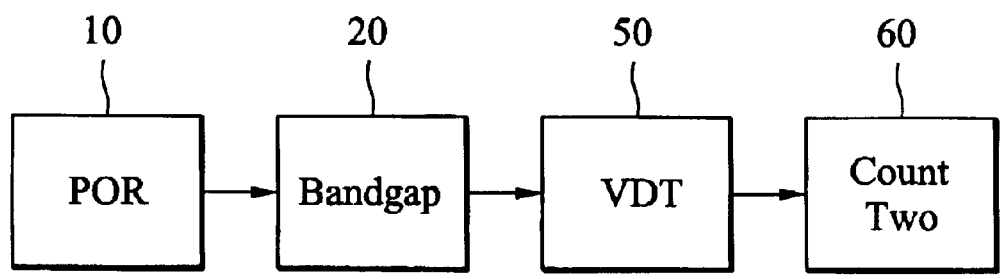
FIG. 2 shows a block diagram of the fast startup oscillator of the present invention.
Figure 3:
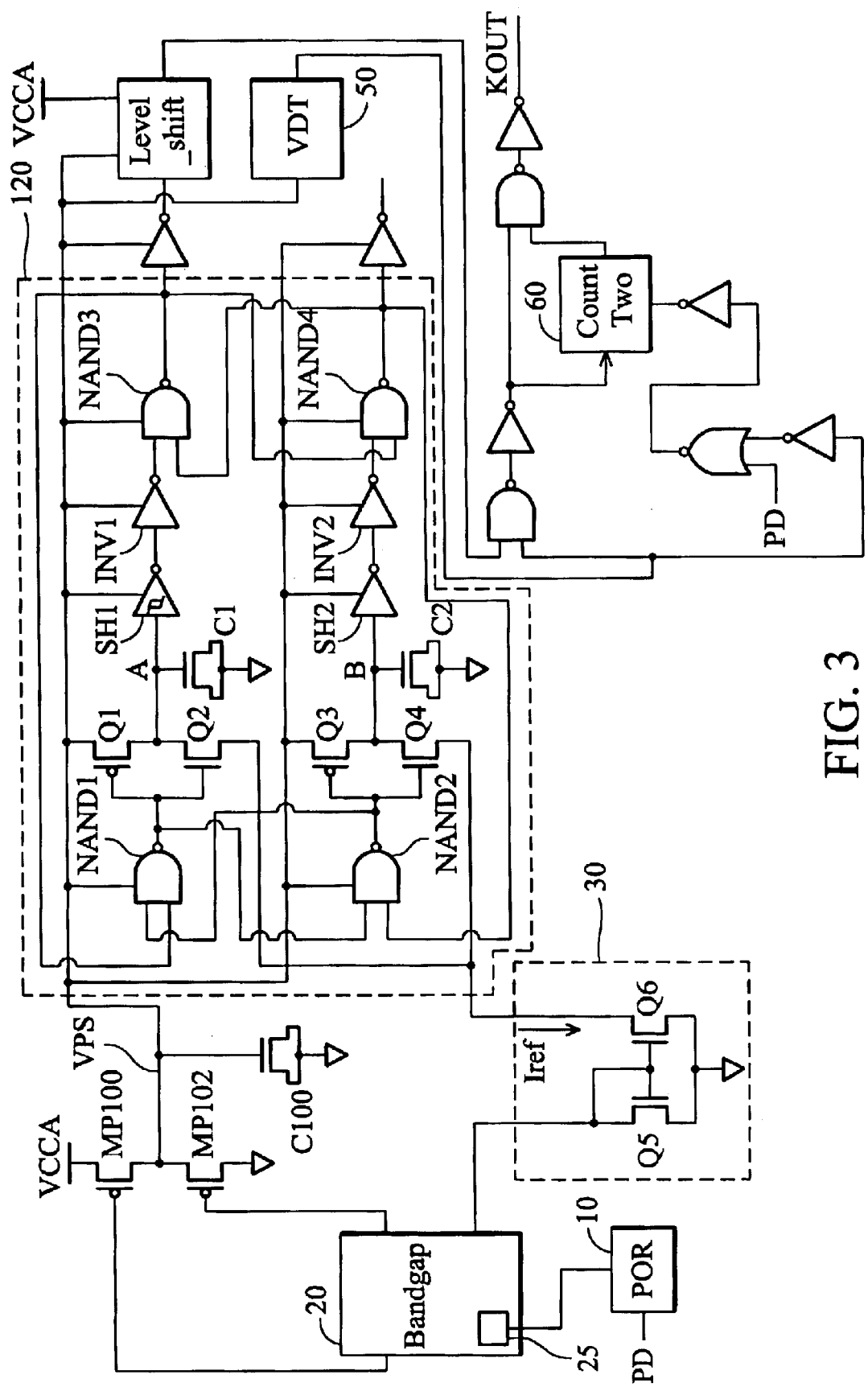
FIG. 3 shows a schematic diagram of the fast start-up oscillator in the present invention.

FIG. 2 shows a block diagram of the fast start-up RC-oscillator of the present invention. The fast start-up oscillator 100 includes a POR (power-on-reset) detect circuit 10, a bandgap circuit 20, a voltage detect circuit 50, and a count two circuit 60. FIG. 3 shows a schematic diagram of the fast start-up oscillator in the present invention. A RC-oscillator 120 included in the fast startup oscillator 100 generates a clock signal, as shown in FIG. 3. Referring FIG. 2, during power-on process, the POR detect circuit 10 detects a first voltage source reaching a first level and sends a first signal to enable the bandgap circuit 20. The voltage detect circuit 50 detects a second voltage source, regulated by the bandgap circuit 20, reaching a second level and sends a second signal to enable the count two circuit 60.

The POR detect circuit 10 serves for two situations of starting up the RC-oscillator 120. Referring to FIG. 3, in one situation, voltage source VCCA starts up, and in the power-down mode is disabled. The fast start-up oscillator 100 must satisfy both situations. When detecting voltage source VCCA powers up to the first level, with sufficient voltage overhead for the bandgap circuit 20, or when the power down signal PD is disabled, the POR detect circuit 10 sends a first signal to acknowledge the start-up circuit 25 to start working.

Figure 4:
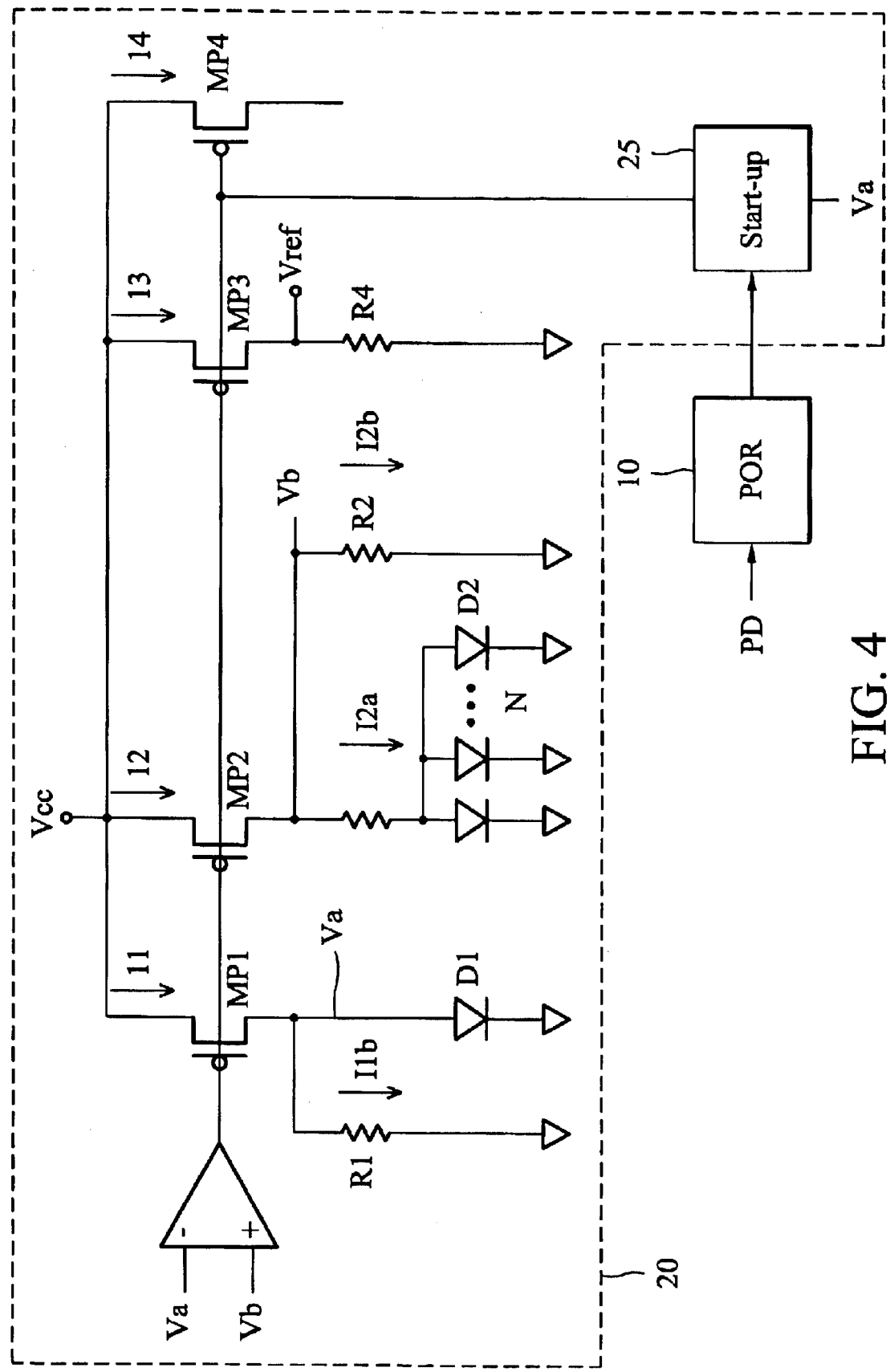
FIG. 4 shows a schematic diagram of the strong start-up bandgap circuit 20.

The strong start-up bandgap circuit 20 is shown FIG. 4. During power on process, were not a start-up circuit 25, the bandgap circuit 20 has two bias points and a long transient time in power-on. As shown in FIG. 4, a start-up circuit 25 is included in the bandgap circuit 20 to address this issue. Receiving the first signal, the start up circuit 25 pulls down voltage of gates of PMOS transistors, MP1, MP2, MP3, and MP4, speeding up the transient time and biasing properly.

The RC oscillator 120 generates the clock signal. Referring to FIG. 3, frequency of the clock signal is related to the voltage source VPS and current from the current source 30. The voltage source VPS is regulated by the bandgap circuit 20, which provides bandgap reference voltage Vref. The current source 30 copies a reference current Iref, generated according to bandgap reference voltage Vref. Therefore, frequency of the RC-oscillator 120 strongly depends on bandgap reference voltage Vref. Bandgap reference voltage Vref is insensitive to temperature, power supply, and process, as is frequency of the clock signal generated by the RC-oscillator 120.

The voltage detect circuit 50 is utilized to ensure the RC-oscillator 120 is supplied properly and oscillates at correct frequency. The RC-oscillator 120 will not oscillate at a correct frequency until voltage source VPS reaches a second level, and thus output KOUT is disabled. When detecting voltage source VPS reaches a second level, the voltage detect circuit 50 sends a second signal to enable the count two circuit 60.

The count two circuit 60 is used to ensure output clock of KOUT be right at the beginning of a period. After voltage source VPS rise to the second level, the RC-oscillator 120 oscillates at a correct frequency, but the first output clock may not be right at the beginning of a period, so the count two circuit 60 counts two output clocks of KOUT then output the clock signal.

Figure 5:
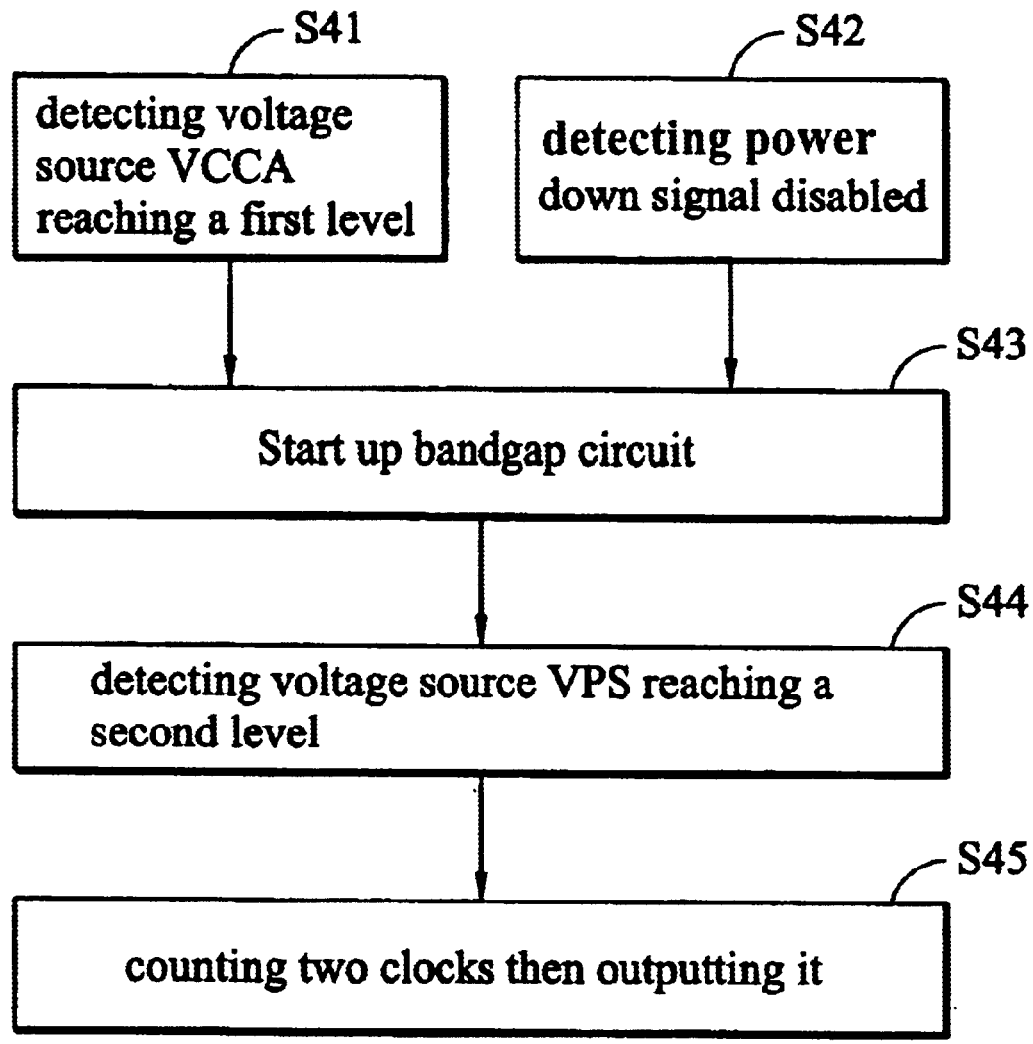
FIG. 5 shows a flow chart of the start-up method.

FIG. 5 shows a flow chart of the start-up method.

At step S41, when the POR detect circuit 10 detects that voltage source VCCA has reached a first level, which meets requirements of the bandgap circuit 20, and sends a first signal to acknowledge the startup circuit 25.

At step S42, when detecting that the power down signal PD is disabled, the POR detect circuit 10 sends a first signal to acknowledge the startup circuit 25.

At step S43, receiving the first signal, the startup circuit 25 drives a large current to pull gates of PMOS transistors MP1, MP2, and MP3 of the bandgap reference circuit 20 down to inject significant currents into diodes D1 and D2. Thereby, the bandgap circuit 20 starts up in a short time, is biased properly, and outputs a bandgap reference voltage.

At step S44, the voltage detect circuit 50 detects that the voltage source VPS has reached a second level, and sends a second signal to the count two circuit 60. When the bandgap reference voltage is established, the voltage source VPS is regulated by the bandgap circuit 20 and rises to a second level, which meets requirements of the RC-oscillator 120.

At step S45, when receiving the second signal, the count two circuit 60 starts to count two clocks of the clock signal and then outputs it.

Figures 6A, 6B:
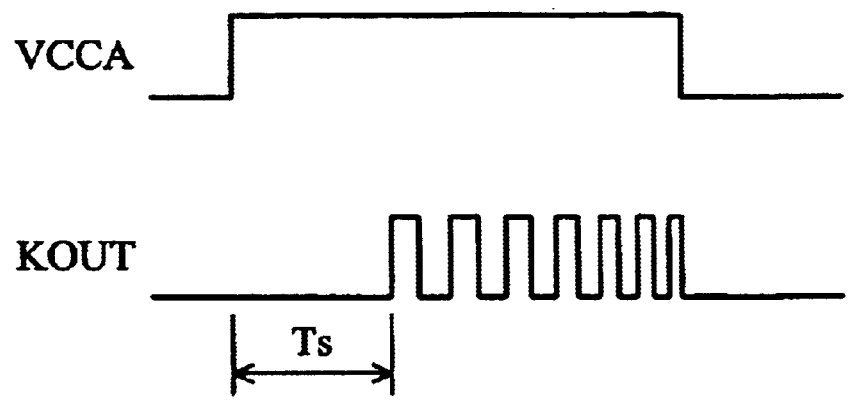
FIG. 6A shows a timing diagram of the power supply startup process.
FIG. 6B shows start-up time of power supply start-up process versus samples, temperature, and voltages.

FIG. 6A shows a timing diagram of the power supply startup process. A start-up time of power supply start-up process is Ts. FIG. 6B shows start-up time of power supply start-up process versus samples, temperature, and voltages. As shown in FIG. 6B, start-up time of power supply start-up process is about 3 u sec to 10 u sec.

Figures 7A, 7B:
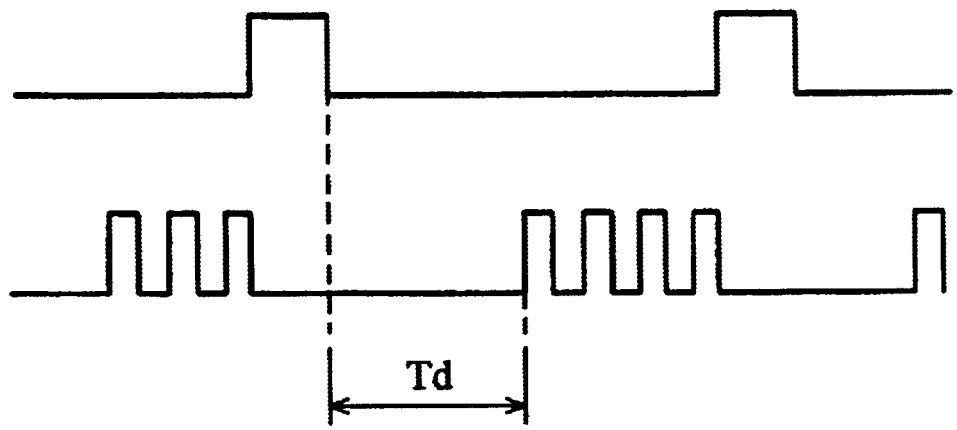
FIG. 7A shows a timing diagram of the power down disabled process.
FIG. 7B shows start-up time of power down disabled process versus samples, temperature, and voltages.

FIG. 7A shows a timing diagram of the power down disabled process. A start-up time of power down disabled process is Td.

FIG. 7B shows start-up time of power down disabled process versus samples, temperature, and voltages. As shown in FIG. 6B, start-up time of power down disabled process is about 3 u sec to 10 u sec.

Still referring to FIG. 3, the RC-oscillator 120 is described in more detail. The RC-oscillator 120 is a relaxation oscillator, which includes RS latches, two capacitors C1, C2, a current source, and two Schmitt triggers SH1, SH2. The RS latch includes gates NAND1, NAND2, NAND3, and NAND4. In this oscillator, alternatively, capacitors C1, C2 are discharged by a current source 30 consisting of transistors Q5, Q6. In a state in which gate NAND3 outputs 0, gate NAND4 outputs 1, then gate NAND1 outputs 1, and gate NAND2 outputs 0. The state causes transistors Q2 and Q3 to be on and transistors Q1 and Q4 to be off. Since transistor Q3 is on, the voltage across capacitor C2 is clamped at VPS. However, the voltage across capacitor C1 will change in a negative-going direction because the current from the current source 30 is flowing through transistor Q2. The voltage across capacitor C1, which started at VPS, reaches a trip point of Schmitt trigger SH1, i.e., threshold voltage Vt of Schmitt trigger SH1, after one-half of a clock period. At this time, the output of the schmitt trigger SH1 goes positive, inverter INV1 goes negative, gate NAND3 outputs 1, gate 4 outputs 0, gate NAND1 outputs 0, and gate 4 outputs 1. The state causes transistors Q1 and Q4 to be on and transistors Q2 and Q3 to be off. When transistor Q1 turns on, the voltage across capacitor C1 is very quickly charged back to VPS. This increased voltage causes the output of schmitt trigger SH1 to go low, and inverter INV1 to go high, so that both inputs to the RS latch are again 1. At the same time, transistor Q4 is turned on, and capacitor C2 begins to discharge until its voltage reaches the trip point of Schmitt trigger SH2. The reason for including Schmitt trigger SH1 and SH2, as opposed to connecting capacitor C1 and C2 directly to the RS latch, is to make the voltage changes across capacitors less sensitive to VPS.

The RC oscillator 120 is supplied by voltage source VPS instead of voltage VCCA. Voltage source VPS is regulated by PMOS transistor MP100 and MP100 according to bandgap reference voltage Vref and stabilized by a capacitor C100. The current Iref is generated according to the bandgap reference voltage Vref. Frequency of the RC-oscillator 120 is stabilized by voltage source VPS.

Referring to FIG. 4, the strong start-up bandgap circuit 20 is described in more detail. The strong start-up bandgap circuit 20 includes PMOS transistors MP1, MP2, MP3, resistors R1, R2, R3, diode connected BJT transistor D1, D2, and an operational amplifier 22. The emitter area of the BJT transistor D2 is N times of the BJT transistor D1. The PMOS transistors MP1 and MP2 have the same aspect ratio. The resistances of the resistors R1, R2 are equal.

The drain of the PMOS transistor MP1 is coupled to the anode of the diode D1 and one end of resistor R1 at node A. The cathode of the diode D1 is coupled to a ground VSS. The other end of the resistor R1 is coupled to the ground VSS.

The drain of the PMOS transistor MP2 is coupled to one end of resistor R2 and one end of the resistor R3 at node B. The other end of the resistor R3 is coupled to the anode of the diode D2, and the cathode of the diode D2 is coupled to the ground VSS. The other end of the resistor R2 is coupled to the ground VSS.

The drain of the PMOS transistor MP3 is coupled to one end of resistor R4. The other end of the resistor R4 is coupled to the ground.

The node A is coupled to the inverting input of the operational amplifier 22. The node B is coupled to the non-inverting input of the operational amplifier 22. The output of the operational amplifier 22 is coupled to the gates of the PMOS transistors MP1, Mp2, and MP3.

The operational amplifier 22 senses voltages VA, VB of the node A, B respectively, driving the gates of the PMOS transistor MP1 and MP2 by negative feedback such that the voltage VA and the voltage VB settle to be equal. Two diode-connected BJT transistors D1, D2 drain the same current given the used emitter area ratio N. The base-emitter voltage of the BJT transistor D1 is VBE1. The base-emitter voltage of the BJT transistor D2 is VBE2. The voltage difference between the base-emitter voltages VBE1, VBE2 is $\Delta VBE$, and the voltage difference $\Delta VBE$ is equal to $VT\ln(N)$. Therefore, the current in the resistor R3 is PTAT (proportional to the absolute temperature). Since the operational amplifier 22 forces two voltages VA and VB to be equal, produces a current in the equal resistor R1 and R2 to VBE1/R1. As a result, the current I1, I2, I2 in MP1, MP2, and MP3 are all equal. The I1 is given by $$I1 = VT\ln(N)/R3 + VBE1/R1$$

The bandgap reference voltage is given by $$Vref = I1*R4 = VT(R4*\ln(N)/R3) + VBE(R4/R1)$$

Two terms form the bandgap reference voltage Vref, one is the voltage VBE1 across the diode connected BJT transistor D1 and the other is a term of VT proportional to the absolute temperature. VT=kT/q is multiplied by a scaling factor to compensate for the temperature dependence of the base-emitter voltage VBE1.

The temperature coefficient of resistors is cancelled if resistors R1, R2, R3, and R4 are made of the same resistor layer and matching layout technique. The compensation of the temperature coefficients of VT and VBE1 =is ensured by a proper choice of N and of the R4/R3 ratio.

The bandgap reference voltage Vref has less variation versus temperature, voltage and process, as do the voltage source VPS and the current Iref. Therefore, the frequency of the RC-oscillator 120 is irrelevant to temperature, voltage, and process.

The advantages of the present invention are:
1. A power-on-reset detect circuit is utilized to ensure that power supply has sufficient level providing to bandgap reference circuit.
2. A start-up circuit is incorporated to fast start up bandgap reference circuit.
3. A regulated voltage source generated from bandgap reference voltage is provided to RC-oscillator such that frequency is less irrelevant to temperature, power supply, and process.
4. A voltage detect circuit is utilized to detect the regulated voltage source reaching proper level.
5. A count two circuit is used to ensure output clock signal at right beginning.

Although the present invention has been described in its preferred embodiment, it is not intended to limit the invention to the precise embodiments disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A fast start-up oscillator comprising:
    a power-on-reset detect circuit for detecting a first voltage source reaching a first level to output a first signal;
    a bandgap circuit for generating a bandgap reference voltage, wherein a start up circuit enabled by the first signal is included for speeding up and biasing the bandgap circuit properly;
    an oscillator having a second voltage source regulated by the bandgap reference voltage and generating a clock signal;
    a voltage detect circuit for detecting the second voltage source to output a second signal; and
    a count circuit for outputting the clock signal at right beginning when enabled by the second signal.

2. The fast start-up oscillator as claimed in claim 1, wherein the power-on-reset detect circuit outputs the first signal when a power down signal is disabled.

3. The fast start-up oscillator as claimed in claim 1, wherein the oscillator is a RC-oscillator.

4. The fast start-up oscillator as claimed in claim 1, wherein the clock signal has an oscillating frequency determined by the second voltage source and a current source generated according to the bandgap reference voltage.

5. The fast start-up oscillator as claimed in claim 1, wherein the count circuit outputs the clock signal after counting two clocks of the clock signal.

6. A fast start-up method for an oscillator comprising:
    detecting a first voltage source reaching a first level to output a first signal;
    detecting the first signal to start up a bandgap circuit generating a bandgap reference voltage by a fast start-up circuit;
    regulating a second voltage source by the bandgap reference voltage;
    providing an oscillator generating a clock signal with the second voltage source;
    detecting the second voltage source reaching a second level to output a second signal; and
    outputting the clock signal at right beginning when detecting the first signal.

7. The fast start-up method for the oscillator as claimed in claim 6, wherein the step of detecting a first voltage source further comprises detecting a disabled power down signal to output the first signal.

8. The fast start up method for a oscillator as claimed in claim 6, wherein the oscillator is a RC-oscillator.

9. The fast start up method for a oscillator as claimed in claim 6, wherein the clock signal has a oscillating frequency determined by the second voltage source and current sources generated according to the bandgap reference voltage.

10. The fast start up method for a oscillator as claimed in claim 6, wherein the step of outputting the clock signal further comprises:
    counting two clocks of the clock signal then outputting the clock signal.

* * * * *